US008165224B2

(12) United States Patent
Simmons et al.

(10) Patent No.: US 8,165,224 B2
(45) Date of Patent: Apr. 24, 2012

(54) DEVICE AND METHOD FOR IMPROVED LOST FRAME CONCEALMENT

(75) Inventors: Sean Simmons, Waterloo (CA); Yi Wen Liu, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 1318 days.

(21) Appl. No.: 11/689,548

(22) Filed: Mar. 22, 2007

(65) Prior Publication Data
US 2008/0235554 A1  Sep. 25, 2008

(51) Int. Cl.
*H04B 1/66* (2006.01)
(52) U.S. Cl. .............................. 375/240.27; 375/240.28
(58) Field of Classification Search ............ 375/240.27, 375/240.28, 240.29
See application file for complete search history.

(56) References Cited

U.S. PATENT DOCUMENTS

| 5,450,449 | A  | * | 9/1995  | Kroon ............................ 375/350 |
| 5,884,010 | A  | * | 3/1999  | Chen et al. .................... 704/228 |
| 6,215,831 | B1 | * | 4/2001  | Nowack et al. ............... 375/340 |
| 6,377,553 | B1 |   | 4/2002  | Vary et al. |
| 6,587,590 | B1 | * | 7/2003  | Pan .............................. 382/250 |
| 6,823,303 | B1 | * | 11/2004 | Su et al. ....................... 704/220 |
| 6,968,309 | B1 | * | 11/2005 | Makinen et al. .............. 704/219 |
| 7,430,238 | B2 | * | 9/2008  | Lin et al. ................. 375/240.16 |
| 2002/0123887 | A1 | * | 9/2002 | Unno ............................ 704/220 |
| 2004/0006462 | A1 | * | 1/2004 | Johnson ........................ 704/214 |
| 2004/0032347 | A1 |   | 2/2004 | Yamazaki |
| 2004/0078745 | A1 |   | 4/2004 | Kruger et al. |
| 2006/0126730 | A1 | * | 6/2006 | Arakawa et al. ......... 375/240.03 |
| 2006/0150049 | A1 | * | 7/2006 | Zhang et al. .................... 714/746 |
| 2006/0222066 | A1 | * | 10/2006 | Yoo et al. ................. 375/240.03 |
| 2006/0222090 | A1 |   | 10/2006 | Simmons et al. |
| 2007/0189618 | A1 | * | 8/2007 | Bivolarski et al. ............ 382/234 |
| 2008/0225950 | A1 | * | 9/2008 | Zhu .......................... 375/240.14 |

FOREIGN PATENT DOCUMENTS

| CA | 2626506 A1 | 9/2008 |
| CN | 1535461 | 10/2004 |
| EP | 1 161 020 A2 | 5/2001 |
| EP | 1 624 585 A2 | 8/2006 |
| EP | 1973254 B1 | 7/2009 |
| WO | WO 2006/105647 A1 | 10/2006 |

OTHER PUBLICATIONS

Chinese Office Action dated Jul. 13, 2010, Chinese Patent Application No. 200810096662.8.
Chinese Office Action dated Nov. 26, 2010, Chinese Application No. 200810096662.8.

(Continued)

*Primary Examiner* — Eleni Shiferaw
*Assistant Examiner* — Abu Sholeman
(74) *Attorney, Agent, or Firm* — Bereskin & Parr LLP/S.E.N.C.R.L., s.r.l.

(57) ABSTRACT

Various embodiments are described herein that make use of a lost frame concealment method for processing data frames received from transmission over a communications channel. The method involves determining whether a current data frame is a bad frame, performing source decoding on the current data frame with one or more parameters that are limited by a first set of one or more values if the current data frame is a bad frame, and performing source decoding on the current data frame with one or more parameters that are not limited if the current data frame is a good frame.

16 Claims, 8 Drawing Sheets

OTHER PUBLICATIONS

European Communication under Rule 71(3) dated Feb. 6, 2009, European Patent Application No. 07104676.7.

European Decision to Grant dated Jun. 18, 2009, European Patent Application No. 07104676.7.

Canadian Office Action dated Feb. 2, 2011, Canadian Patent Application No. 2,626,506.

3GPP Organizational Partners, 3GPP TS 26.091 V6.0.0 (Dec. 2004) Technical Specification 3rdGeneration Partnership Project; Technical Specification Group Services and System Aspects; Mandatory Speech Codec speech processing functions; Adaptive Multi-Rate (AMR) speech codec; Error concealment of lost frames (Release 6), 2004.

Alfred Mertins, Image Recovery from Noisy Transmission using Soft Bits and Markov Random Field Models, University of Oldenburg, School of Mathematics and Natural Sciences, Germany, http://www.uni-oldenburg.de/sigproc/papers/mertins-oe-oct03.pdf, Oct. 2003.

Tim Fingscheidt and Peter Vary, Softbit Speech Decoding: A New Approach to Error Concealment, IEEE Transactions on Speech and Audio Processing, vol. 9, No. 3, Mar. 2001, pp. 240-251.

Justin Dauwels et al., Synchronization of a Chaotic Dynamical System Using a Soft-Decision Receiver, Signal & Information Proc. Lab. (ISI), ETH Zentrum, (4 pages), www.media.mit.edu/rvigoda/phd/ben.vigoda.ct.n11.pdf.

Jorg Kliewer and Norbert Gortz, Soft-Input Source Decoding for Robust Transmission of Compressed Images Using Two-Dimensional Optimal Estimation, University of Kiel, Institute for Circuits and Systems Theory, Proceedings ICASSP 2001, vol. IV, May 2001, pp. 2565-2568.

Farshad Lahouti and Amir K. Khandani, Soft Reconstruction of Speech in the Presence of Noise and Packet Loss, Technical Report UW-E&CE#2003-4, Department of Electrical & Computer Engineering, University of Waterloo, May 15, 2003, pp. 1-29.

Marc Adrat et al., The EXIT-Characteristic of Softbit-Source Decoders, IEEE Communications Letters, vol. 9, No. 6, Jun. 2005, pp. 540-542.

M. Adrat et al., Softbit-Source Decoding Based on the Turbo-Principle, Institute of Communication Systems and Data Processing, Aachen, University of Technology, 2001 IEEE VTS 54th Vehicular Technology Conference, pp. 2252-2256.

M. Adrat, et al., Iterative Source-Channel Decoder Using Extrinsic Information from Softbit-Source Decoding, Institute of Communication Systems and Data Processing, Aachen, University of Technology, 2001 IEEE International Acoustics, Speech, and Signal Processing, Proceedings (ICASSP '01), pp. 2653-2656.

M. Adrat et al., Efficient Near-Optimum Softbit Source Decoding for Sources with Inter- and Intra-Frame Redundancy, Institute of Communications Systems and Data Processing, Aachen University (RWTH), IEEE International Acoustics, Speech, and Signal Processing, 2004, Proceeding (ICASSP '04), pp. IV-653-IV-656.

Extended European search report for corresponding EP patent application EP 07104676.7, dated Aug. 21, 2007.

International Search Report and Written Opinion for international application No. PCT/CA2006/000505, date of mailing Jul. 18, 2006.

International Preliminary Report on Patentability (IPRP) for international application No. PCT/CA2006/000505, date of mailing Jul. 9, 2007.

Chinese Notification of Grant dated May 27, 2011, Chinese Patent Application No. 200810096662.8.

Canadian Office Action Response dated Jul. 28, 2011, Canadian Patent Application No. 2,626,506.

\* cited by examiner

DEVICE AND METHOD FOR IMPROVED LOST FRAME CONCEALMENT

FIELD

The embodiments described herein generally relate to a system and method for improved processing of received data depending on channel conditions in a communication system.

BACKGROUND

In voice and data communications networks, there is an on-going need to minimize bandwidth requirements and improve the quality of voice or data traffic. Reducing the bandwidth is typically achieved by implementing compression algorithms to remove redundancy from a signal. On the other hand, signal quality is typically improved by adding redundancy to a signal by, for example, implementing error detection and correction techniques, and by recovering from errors by using lost frame concealment techniques.

Conventional systems attempt to achieve a balance between bandwidth and quality by using a combination of methods. Generally, in a conventional system, at the transmitting side, a source coder/quantizer is provided to quantize and compress the signal to be transmitted, i.e. reduce the bandwidth required, while a channel coder is provided to add information for use in error detection and correction, i.e. improve quality. The signal then travels through a channel (data link) where it may be corrupted. At the receiving side, a corresponding channel decoder, lost frame handler and source decoder are provided to decode the signal received.

One of the issues in communication systems is that, as the interference level increases, the quality of recovered signal falls off rapidly. One conventional approach to overcome this problem has been the use of adaptive source/channel coding (e.g. GSM's Adaptive Multi-Rate (AMR)). Adaptive source/channel coding allows a variation in the level of source coding based on the amount of interference found on the channel data link. For example, a lower level of source coding is performed when the level of interference is high. This allows for more redundancy in the signal and thus, the interference will have less impact on the signal. However, this also has the effect of increasing bandwidth requirements. In a similar way, when the level of interference is low, a higher level of source coding can be used. In this way, adjustments can be made adaptively to counteract the effects of interference during signal transmission.

While adaptive source/channel coding adjusts the source coder based on interference conditions, other conventional approaches are directed to the receiver side of the channel. In a communication system, when a data bit is received, there is some uncertainty as to whether or not the bit is a 1 or a 0 due to distortion, interference, noise on the channel, or the like. In a conventional system, the channel decoder would typically examine an incoming signal and make a decision to determine whether a particular received bit is a 1 or a 0.

A source decoder then receives the bits and processes this data using various well-known techniques depending on the processing performed by the channel decoder to output a recovered signal. However, prior to processing by the source decoder, lost frame concealment techniques are employed to deal with frames of data that are lost or otherwise damaged.

BRIEF DESCRIPTION OF THE DRAWINGS

For a better understanding of the following embodiments described herein, and to show more clearly how the various embodiments described herein may be carried into effect, reference will be made, by way of example, to the accompanying drawings which show at least one exemplary embodiment, and in which.

DETAILED DESCRIPTION OF THE EMBODIMENTS

Figure 1:
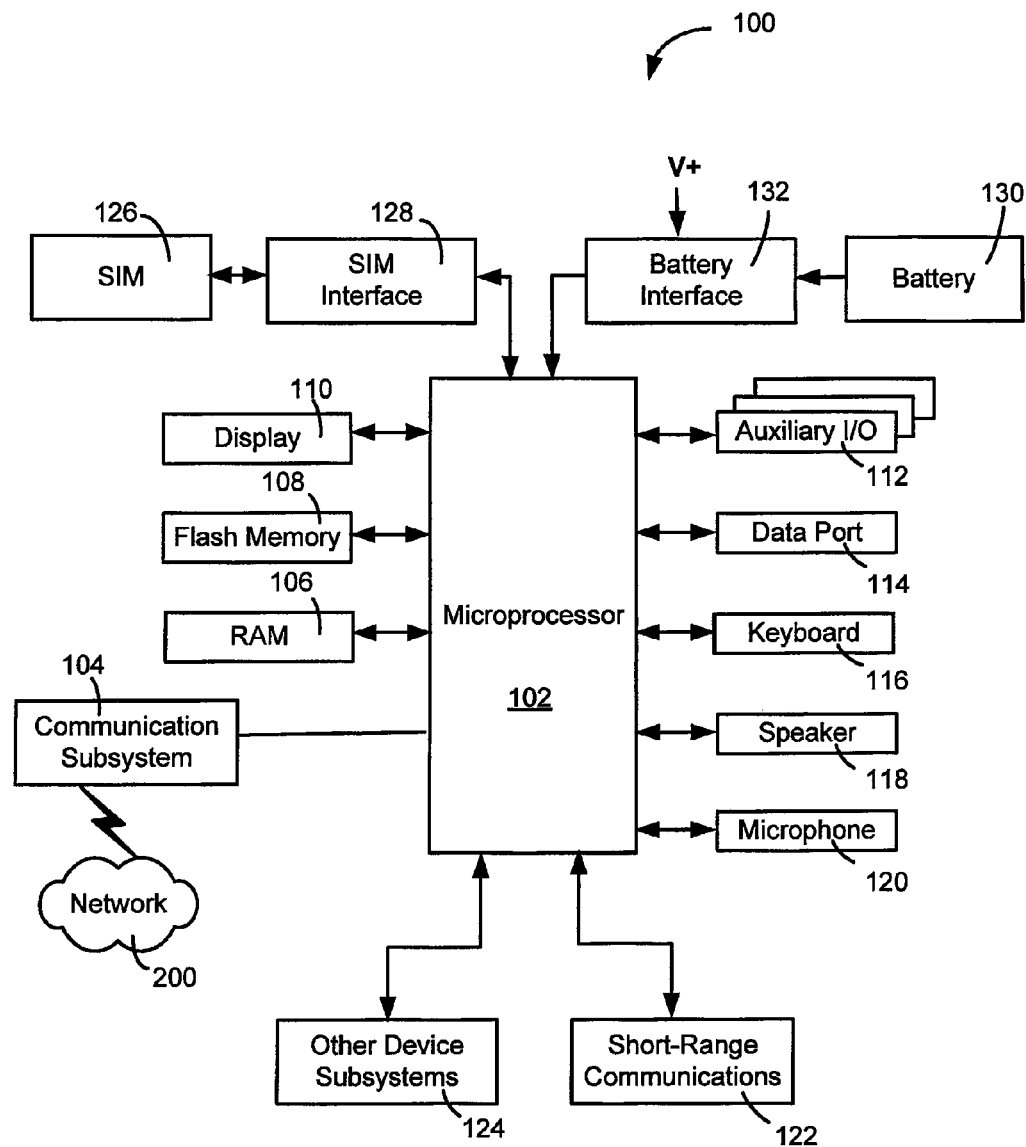
FIG. 1 is a block diagram of a mobile device in one exemplary implementation.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein. The detailed description begins with a general description of a mobile environment and then proceeds to describe the application of exemplary embodiments within this environment.

The mobile environment involves use of a mobile device. A mobile device is a two-way communication device with advanced data communication capabilities having the capability to communicate with other computer systems, and is also referred to herein generally as a mobile device. The mobile device may also include the capability for voice communications. Depending on the functionality provided by a mobile device, it may be referred to as a data messaging device, a two-way pager, a cellular telephone with data messaging capabilities, a wireless Internet appliance, or a data communication device (with or without telephony capabilities). A mobile device communicates with other devices through a network of transceiver stations. To aid the reader in understanding the structure of a mobile device and how it communicates with other devices, reference is made to FIGS. 1 through 3.

Referring first to FIG. 1, a block diagram of a mobile device in one example implementation is shown generally as 100. Mobile device 100 comprises a number of components, the controlling component being microprocessor 102. Microprocessor 102 controls the overall operation of mobile device 100. Communication functions, including data and voice communications, are performed through communication subsystem 104. Communication subsystem 104 receives messages from and sends messages to a wireless network 200. In this exemplary implementation of mobile device 100, communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that embodiments are intended to use any other suitable standards that are developed in the future. The wireless link connecting communication subsystem 104 with network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network associated with mobile device 100 is a GSM/GPRS wireless network in one exemplary implementation of mobile device 100, other wireless networks may also be associated with mobile device 100 in variant implementations. Different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and future third-generation (3G) networks like EDGE and UMTS. Some older examples of data-centric networks include the Mobitex™ Radio Network and the DataTAC™ Radio Network. Examples of older voice-centric data networks include Personal Communication Systems (PCS) networks like GSM and Time Division Multiple Access (TDMA) systems. Other network communication technologies that may be employed include, for example, Integrated Digital Enhanced Network (iDEN™), Evolution-Data Optimized (EV-DO), High Speed Downlink Packet Access (HSDPA), and Wireless LAN technology as specified in the 802.11 series of standards.

Microprocessor 102 also interacts with additional subsystems such as a Random Access Memory (RAM) 106, flash memory 108, display 110, auxiliary input/output (I/O) subsystem 112, data port 114, keyboard 116, speaker 118, microphone 120, short-range communications subsystem 122 and other devices 124.

Some of the subsystems of mobile device 100 perform communication-related functions, whereas other subsystems may provide "resident" or on-device functions. By way of example, display 110 and keyboard 116 may be used for both communication-related functions, such as entering a text message for transmission over network 200, and device-resident functions such as a calculator or task list. Operating system software used by microprocessor 102 is typically stored in a persistent store such as flash memory 108, which may alternatively be a read-only memory (ROM) or similar storage element (not shown). Those skilled in the art will appreciate that the operating system, specific device applications, or parts thereof, may be temporarily loaded into a volatile store such as RAM 106.

Mobile device 100 may send and receive communication signals over network 200 after required network registration or activation procedures have been completed. Network access is associated with a subscriber or user of a mobile device 100. To identify a subscriber, mobile device 100 may require a Subscriber Identity Module or "SIM" card 126 to be inserted in a SIM interface 128 in order to communicate with a network. SIM 126 is one type of a conventional "smart card" used to identify a subscriber of mobile device 100 and to personalize the mobile device 100, among other things. Without SIM 126, mobile device 100 is not fully operational for communication with network 200. By inserting SIM 126 into SIM interface 128, a subscriber can access all subscribed services. Services could include: web browsing and messaging such as e-mail, voice mail, Short Message Service (SMS), and Multimedia Messaging Services (MMS). More advanced services may include: point of sale, field service and sales force automation. SIM 126 includes a processor and memory for storing information. Once SIM 126 is inserted in SIM interface 128, it is coupled to microprocessor 102. In order to identify the subscriber, SIM 126 contains some user parameters such as an International Mobile Subscriber Identity (IMSI). An advantage of using SIM 126 is that a subscriber is not necessarily bound by any single physical mobile device. SIM 126 may store additional subscriber information for a mobile device as well, including datebook (or calendar) information and recent call information.

Mobile device 100 includes a battery interface 132 for receiving one or more batteries 130. The battery 130 may be rechargeable. Battery interface 132 is coupled to a regulator (not shown), which assists battery 130 in providing power V+ to mobile device 100. Although current technology makes use of a battery, future technologies such as micro fuel cells may provide the power to mobile device 100.

Microprocessor 102, in addition to its operating system functions, enables execution of software applications on mobile device 100. A set of applications that control basic device operations, including data and voice communication applications, will normally be installed on mobile device 100 during its manufacture. Another application that may be loaded onto mobile device 100 would be a personal information manager (PIM). A PIM has functionality to organize and manage data items of interest to a subscriber, such as, but not limited to, e-mail, calendar events, voice mails, appointments, and task items. A PIM application has the ability to send and receive data items via wireless network 200. PIM data items may be seamlessly integrated, synchronized, and updated via wireless network 200 with the mobile device subscriber's corresponding data items stored and/or associated with a host computer system. This functionality creates a mirrored host computer on mobile device 100 with respect to such items. This can be particularly advantageous where the host computer system is the mobile device subscriber's office computer system.

Additional applications may also be loaded onto mobile device 100 through network 200, auxiliary I/O subsystem 112, data port 114, short-range communications subsystem 122, or any other suitable subsystem 124. This flexibility in application installation increases the functionality of mobile device 100 and may provide enhanced on-device functions, communication-related functions, or both. For example, secure communication applications may enable electronic commerce functions and other such financial transactions to be performed using mobile device 100.

Data port 114 enables a subscriber to set preferences through an external device or software application and extends the capabilities of mobile device 100 by providing for information or software downloads to mobile device 100 other than through a wireless communication network. The alternate download path may, for example, be used to load an encryption key onto mobile device 100 through a direct and thus reliable and trusted connection to provide secure device communication. Data port 114 may be a suitable port that enables data communication between the mobile device 100 and another computing device. For example, the data port 114 may be a serial or parallel port and may also include a power line to provide power to the mobile device 100, as is available with Universal Serial Bus (USB) ports.

Short-range communications subsystem 122 provides for communication between mobile device 100 and different systems or devices, without the use of network 200. For example, subsystem 122 may include an infrared device and associated circuits and components for short-range communication. Examples of short range communication would include standards developed by the Infrared Data Association (IrDA), Bluetooth, and the 802.11 family of standards developed by IEEE.

In use, a received signal such as a text message, an e-mail message, or web page download will be processed by communication subsystem 104 and input to microprocessor 102. Microprocessor 102 will then process the received signal for output to display 110 or alternatively to auxiliary I/O subsystem 112. A subscriber may also compose data items, such as e-mail messages, for example, using keyboard 116 in conjunction with display 110 and possibly auxiliary I/O subsystem 112. Auxiliary subsystem 112 may include devices such as: a touch screen, mouse, track ball, infrared fingerprint detector, or a roller wheel with dynamic button pressing capability. Keyboard 116 is an alphanumeric keyboard and/or telephone-type keypad. A composed item may be transmitted over network 200 through communication subsystem 104.

For voice communications, the overall operation of mobile device 100 is substantially similar, except that the received signals would be output to speaker 118, and signals for transmission would be generated by microphone 120. Alternative voice or audio I/O subsystems, such as a voice message recording subsystem, may also be implemented on mobile device 100. Although voice or audio signal output is accomplished primarily through speaker 118, display 110 may also be used to provide additional information such as the identity of a calling party, duration of a voice call, or other voice call related information.

Figure 2:
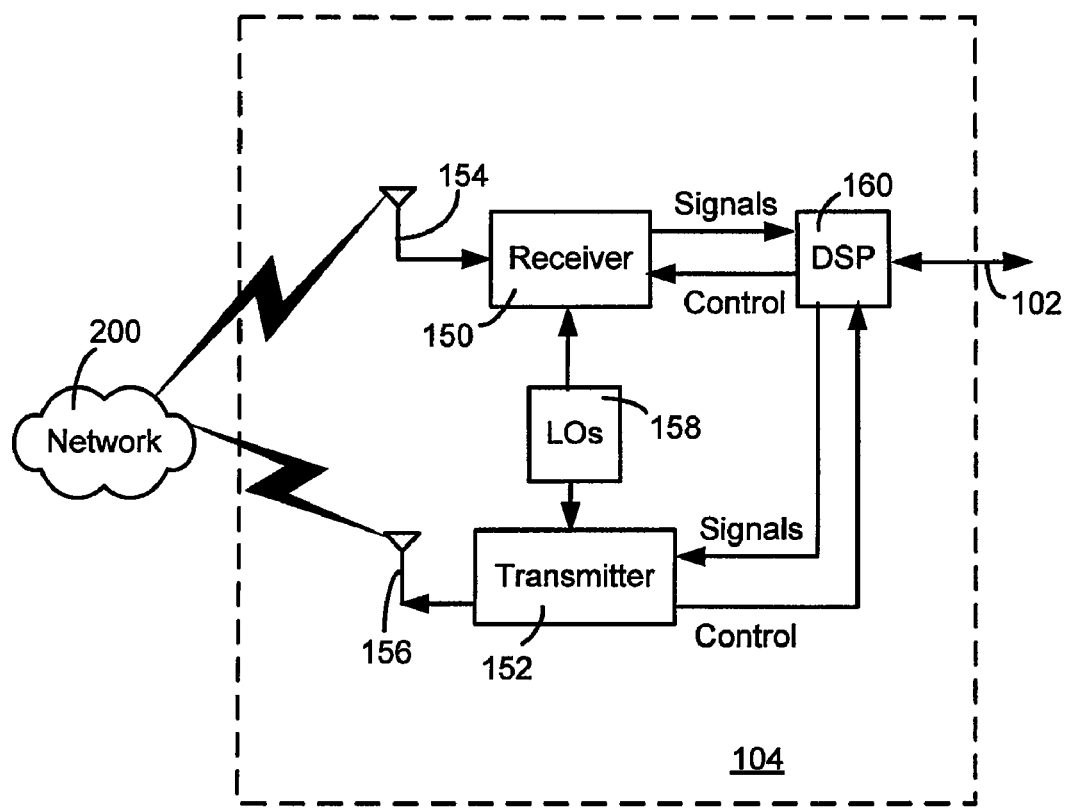
FIG. 2 is a block diagram of an exemplary embodiment of a communication subsystem component of the mobile device of FIG. 1.

Referring now to FIG. 2, a block diagram of the communication subsystem component 104 of FIG. 1 is shown. Communication subsystem 104 comprises a receiver 150, a transmitter 152, one or more embedded or internal antenna elements 154, 156, Local Oscillators (LOs) 158, and a processing module such as a Digital Signal Processor (DSP) 160.

The particular design of communication subsystem 104 is dependent upon the network 200 in which mobile device 100 is intended to operate, thus it should be understood that the design illustrated in FIG. 2 serves only as one example. Signals received by antenna 154 through network 200 are input to receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed in DSP 160. In a similar manner, signals to be transmitted are processed, including modulation and encoding, by DSP 160. These DSP-processed signals are input to transmitter 152 for digital-to-analog (D/A) conversion, frequency up conversion, filtering, amplification and transmission over network 200 via antenna 156. DSP 160 not only processes communication signals, but also provides for receiver and transmitter control. For example, the gains applied to communication signals in receiver 150 and transmitter 152 may be adaptively controlled through automatic gain control algorithms implemented in DSP 160.

The wireless link between mobile device 100 and a network 200 may contain one or more different channels, typically different RF channels, and associated protocols used between mobile device 100 and network 200. An RF channel is a limited resource that must be conserved, typically due to limits in overall bandwidth and limited battery power of mobile device 100.

When mobile device 100 is fully operational, transmitter 152 is typically keyed or turned on only when it is sending to network 200 and is otherwise turned off to conserve resources. Similarly, receiver 150 is periodically turned off to conserve power until it is needed to receive signals or information (if at all) during designated time periods.

Figure 3:
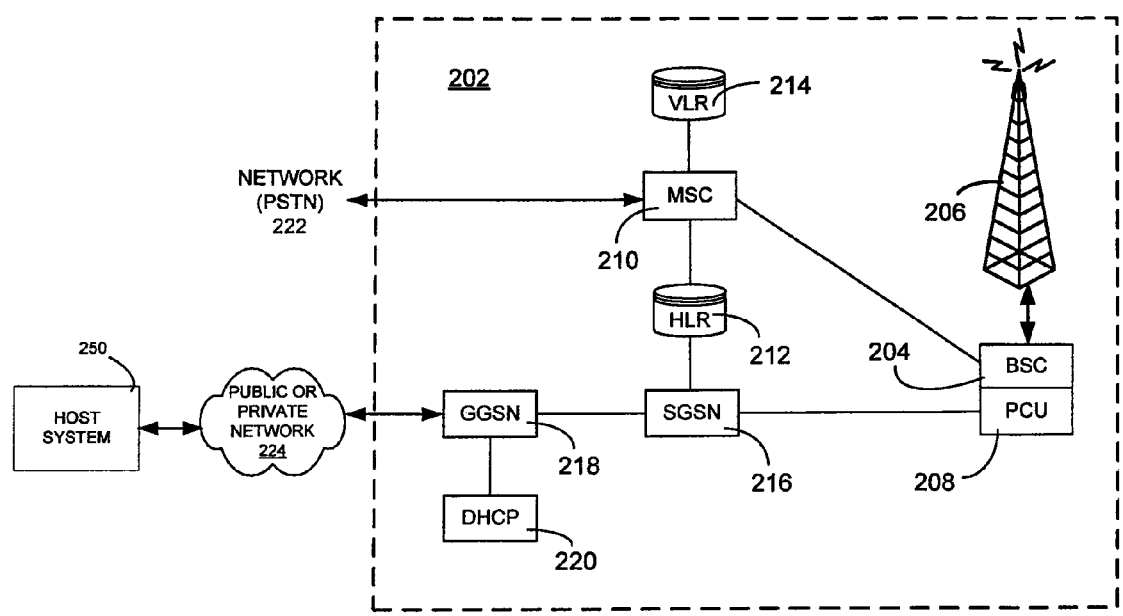
FIG. 3 is a block diagram of a node of a wireless network in one exemplary implementation.

Referring now to FIG. 3, a block diagram of a node of a wireless network is shown as 202. In practice, network 200 comprises one or more nodes 202. Mobile device 100 communicates with a node 202 within wireless network 200. In the exemplary implementation of FIG. 3, node 202 is configured in accordance with General Packet Radio Service (GPRS) and Global Systems for Mobile (GSM) technologies. Node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through network 200.

In a GSM network, MSC 210 is coupled to BSC 204 and to a landline network, such as a Public Switched Telephone Network (PSTN) 222 to satisfy circuit switched requirements. The connection through PCU 208, SGSN 216 and GGSN 218 to the public or private network (Internet) 224 (also referred to herein generally as a shared network infrastructure) represents the data path for GPRS capable mobile devices. In a GSM network extended with GPRS capabilities, BSC 204 also contains a Packet Control Unit (PCU) 208 that connects to SGSN 216 to control segmentation, radio channel allocation and to satisfy packet switched requirements. To track mobile device location and availability for both circuit switched and packet switched management, HLR 212 is shared between MSC 210 and SGSN 216. Access to VLR 214 is controlled by MSC 210.

Station 206 is a fixed transceiver station. Station 206 and BSC 204 together form the fixed transceiver equipment. The fixed transceiver equipment provides wireless network coverage for a particular coverage area commonly referred to as a "cell". The fixed transceiver equipment transmits communication signals to and receives communication signals from mobile devices within its cell via station 206. The fixed transceiver equipment normally performs such functions as modulation and possibly encoding and/or encryption of signals to be transmitted to the mobile device in accordance with particular, usually predetermined, communication protocols and parameters, under control of its controller. The fixed transceiver equipment similarly demodulates and possibly decodes and decrypts, if necessary, any communication signals received from mobile device 100 within its cell. Communication protocols and parameters may vary between different nodes. For example, one node may employ a different modulation scheme and operate at different frequencies than other nodes.

For all mobile devices 100 registered with a specific network, permanent configuration data such as a user profile is stored in HLR 212. HLR 212 also contains location information for each registered mobile device and can be queried to determine the current location of a mobile device. MSC 210 is responsible for a group of location areas and stores the data of the mobile devices currently in its area of responsibility in VLR 214. Further VLR 214 also contains information on mobile devices that are visiting other networks. The information in VLR 214 includes part of the permanent mobile device data transmitted from HLR 212 to VLR 214 for faster access. By moving additional information from a remote HLR 212 node to VLR 214, the amount of traffic between these nodes can be reduced so that voice and data services can be provided with faster response times and at the same time requiring less use of computing resources.

SGSN 216 and GGSN 218 are elements added for GPRS support; namely packet switched data support, within GSM. SGSN 216 and MSC 210 have similar responsibilities within wireless network 200 by keeping track of the location of each mobile device 100. SGSN 216 also performs security functions and access control for data traffic on network 200. GGSN 218 provides internetworking connections with external packet switched networks and connects to one or more SGSN's 216 via an Internet Protocol (IP) backbone network operated within the network 200. During normal operations, a given mobile device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring a DHCP server 220 connected to the GGSN 218. There are many mechanisms for dynamic IP assignment, including using a combination of a Remote Authentication Dial-In User Service (RADIUS) server and DHCP server. Once the GPRS Attach is complete, a logical connection is established from a mobile device 100, through PCU 208, and SGSN 216 to an Access Point Node (APN) within GGSN 218. The APN represents a logical end of an IP tunnel that can either access direct Internet compatible services or private network connections. The APN also represents a security mechanism for network 200, insofar as each mobile device 100 must be assigned to one or more APNs and mobile devices 100 cannot exchange data without first performing a GPRS Attach to an APN that it has been authorized to use. The APN may be considered to be similar to an Internet domain name such as "myconnection.wireless.com".

Once the GPRS Attach is complete, a tunnel is created and all traffic is exchanged within standard IP packets using any protocol that can be supported in IP packets. This includes tunneling methods such as IP over IP as in the case with some IPSecurity (Ipsec) connections used with Virtual Private Networks (VPN). These tunnels are also referred to as Packet Data Protocol (PDP) Contexts and there are a limited number of these available in the network 200. To maximize use of the PDP Contexts, network 200 will run an idle timer for each PDP Context to determine if there is a lack of activity. When a mobile device 100 is not using its PDP Context, the PDP Context can be deallocated and the IP address returned to the IP address pool managed by DHCP server 220.

Figure 4:
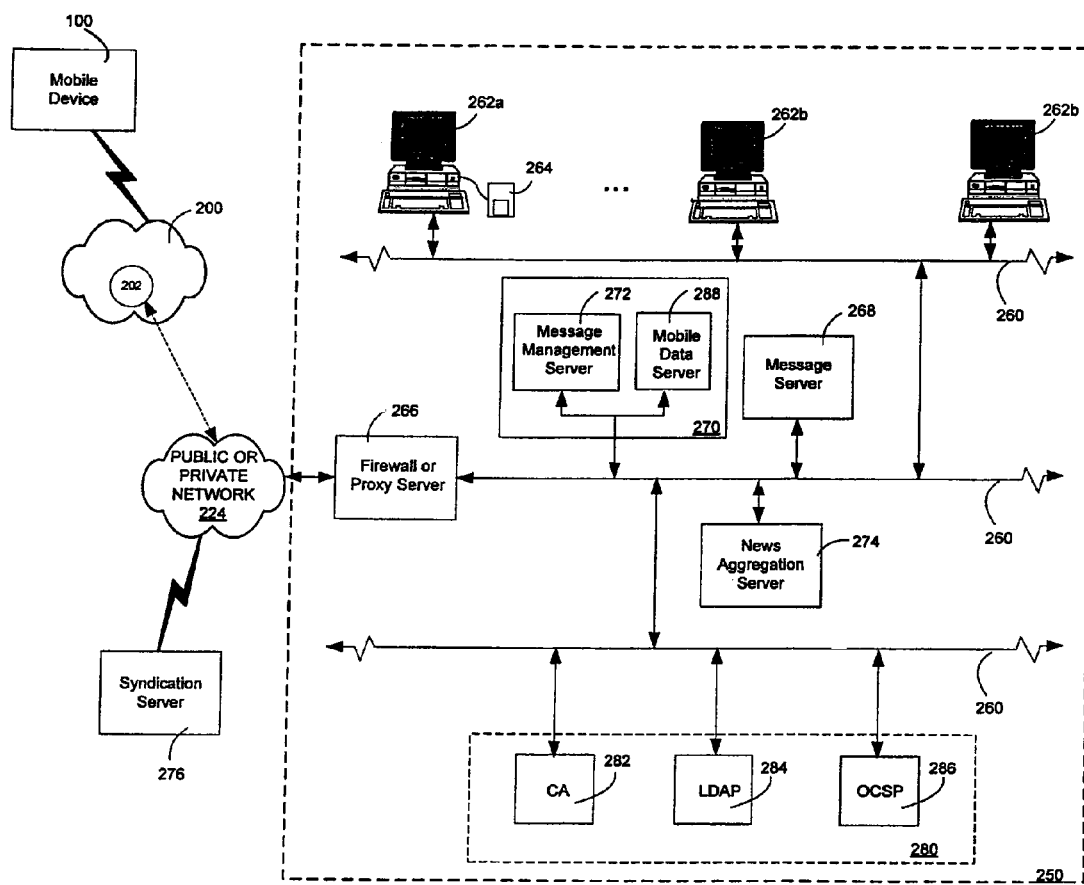
FIG. 4 is a block diagram illustrating components of a host system in one exemplary implementation.

Referring now to FIG. 4, a block diagram illustrating components of a host system in one exemplary configuration is shown. Host system 250 will typically be a corporate office or other local area network (LAN), but may instead be a home office computer or some other private system, for example, in variant implementations. In this example shown in FIG. 4, host system 250 is depicted as a LAN of an organization to which a user of mobile device 100 belongs.

LAN 250 comprises a number of network components connected to each other by LAN connections 260. For instance, a user's desktop computer 262a with an accompanying cradle 264 for the user's mobile device 100 is situated on LAN 250. Cradle 264 for mobile device 100 may be coupled to computer 262a by a serial or a Universal Serial Bus (USB) connection, for example. Other user computers 262b are also situated on LAN 250, and each may or may not be equipped with an accompanying cradle 264 for a mobile device. Cradle 264 facilitates the loading of information (e.g. PIM data, private symmetric encryption keys to facilitate secure communications between mobile device 100 and LAN 250) from user computer 262a to mobile device 100, for example, through data port 114, and may be particularly useful for bulk information updates often performed in initializing mobile device 100 for use. The information downloaded to mobile device 100 may include certificates used in the exchange of messages. It will be understood by persons skilled in the art that the cradle 264 is not required to connect the mobile device 100 to the computer 262a and that computers 262a, 262b can also be connected to other peripheral devices not explicitly shown in FIG. 4.

Furthermore, only a subset of network components of LAN 250 are shown in FIG. 4 for ease of exposition, and it will be understood by persons skilled in the art that LAN 250 will generally comprise additional components not explicitly shown in FIG. 4, for this exemplary configuration. More generally, LAN 250 may represent a smaller part of a larger network (not shown) of the organization, and may comprise different components and/or be arranged in different topologies than that shown in the example of FIG. 4.

In this example, mobile device 100 communicates with LAN 250 through a node 202 of wireless network 200 and a shared network infrastructure 224 such as a service provider network or the public Internet. Access to LAN 250 may be provided through one or more routers (not shown), and computing devices of LAN 250 may operate from behind a firewall or proxy server 266.

In a variant implementation, LAN 250 comprises a wireless VPN router (not shown) to facilitate data exchange between the LAN 250 and mobile device 100. The concept of a wireless VPN router is new in the wireless industry and implies that a VPN connection can be established directly through a specific wireless network to mobile device 100. The possibility of using a wireless VPN router has only recently been available and could be used when Internet Protocol (IP) Version 6 (IPV6) arrives into IP-based wireless networks. This new protocol will provide enough IP addresses to dedicate an IP address to every mobile device, making it possible to push information to a mobile device at any time. An advantage of using a wireless VPN router is that it could be an off-the-shelf VPN component, not requiring a separate wireless gateway and separate wireless infrastructure to be used. A VPN connection can be a Transmission Control Protocol (TCP)/IP or User Datagram Protocol (UDP)/IP connection to deliver the messages directly to mobile device 100 in this variant implementation.

Messages intended for a user of mobile device 100 are initially received by a message server 268 of LAN 250. Such messages may originate from any of a number of sources. For instance, a message may have been sent by a sender from a computer 262b within LAN 250, from a different mobile device (not shown) connected to wireless network 200 or to a different wireless network, or from a different computing device or other device capable of sending messages, via the shared network infrastructure 224, and possibly through an application service provider (ASP) or Internet service provider (ISP), for example.

Message server 268 typically acts as the primary interface for the exchange of messages, particularly e-mail messages, within the organization and over the shared network infrastructure 224. Each user in the organization that has been set up to send and receive messages is typically associated with a user account managed by message server 268. One example of a message server 268 is a Microsoft Exchange™ Server. In some implementations, LAN 250 may comprise multiple message servers 268. Message server 268 may also be adapted to provide additional functions beyond message management, including the management of data associated with calendars and task lists, for example.

When messages are received by message server 268, they are typically stored in a message store (not explicitly shown), from which messages can be subsequently retrieved and delivered to users. For instance, an e-mail client application operating on a user's computer 262a may request the e-mail messages associated with that user's account stored on message server 268. These messages are then typically be retrieved from message server 268 and stored locally on computer 262a.

When operating mobile device 100, the user may wish to have e-mail messages retrieved for delivery to the handheld. An e-mail client application operating on mobile device 100 may also request messages associated with the user's account from message server 268. The e-mail client may be configured, either by the user or by an administrator, possibly in accordance with an organization's information technology (IT) policy, to make this request at the direction of the user, at some pre-defined time interval, or upon the occurrence of some pre-defined event. In some implementations, mobile device 100 is assigned its own e-mail address, and messages addressed specifically to mobile device 100 are automatically redirected to mobile device 100 as they are received by message server 268.

To facilitate the wireless communication of messages and message-related data between mobile device 100 and components of LAN 250, a number of wireless communications support components 270 may be provided. In this example implementation, wireless communications support components 270 comprise a message management server 272, for example. Message management server 272 is used to specifically provide support for the management of messages, such as e-mail messages, that are to be handled by mobile devices. Generally, while messages are still stored on message server 268, message management server 272 can be used to control when, if, and how messages should be sent to mobile device 100. Message management server 272 also facilitates the handling of messages composed on mobile device 100, which are sent to message server 268 for subsequent delivery.

For example, message management server 272 may: 1) monitor the user's "mailbox" (e.g. the message store associated with the user's account on message server 268) for new e-mail messages; 2) apply user-definable filters to new messages to determine if and how the messages will be relayed to the user's mobile device 100; 3) compress and encrypt new messages (e.g. using an encryption technique such as Data Encryption Standard (DES), Triple DES or Advanced Encryption Standard (AES)) and 4) push them to mobile device 100 via the shared network infrastructure 224 and wireless network 200; and receive messages composed on mobile device 100 (e.g. encrypted using Triple DES), decrypt and decompress the composed messages, re-format the composed messages if desired so that they will appear to have originated from the user's computer 262a, and re-route the composed messages to message server 268 for delivery.

Certain properties or restrictions associated with messages that are to be sent from and/or received by mobile device 100 can be defined (e.g. by an administrator in accordance with IT policy) and enforced by message management server 272. These may include whether mobile device 100 may receive encrypted and/or signed messages, minimum encryption key sizes, whether outgoing messages must be encrypted and/or signed, and whether copies of all secure messages sent from mobile device 100 are to be sent to a pre-defined copy address, for example. Message management server 272 may also be adapted to provide other control functions, such as only pushing certain message information or pre-defined portions (e.g. "blocks") of a message stored on message server 268 to mobile device 100. For example, when a message is initially retrieved by mobile device 100 from message server 268, message management server 272 is adapted to push only the first part of a message to mobile device 100, with the part being of a pre-defined size (e.g. 2 KB). The user can then request more of the message, to be delivered in similar-sized blocks by message management server 272 to mobile device 100, possibly up to a maximum pre-defined message size. Accordingly, message management server 272 facilitates better control over the type of data and the amount of data that is communicated to mobile device 100, and can help to minimize potential waste of bandwidth or other resources.

It will be understood by persons skilled in the art that message management server 272 need not be implemented on a separate physical server in LAN 250 or other network. For example, some or all of the functions associated with message management server 272 may be integrated with message server 268, or some other server in LAN 250. Furthermore, LAN 250 may comprise multiple message management servers 272, particularly in variant implementations where a large number of mobile devices needs to be supported.

Figure 5:
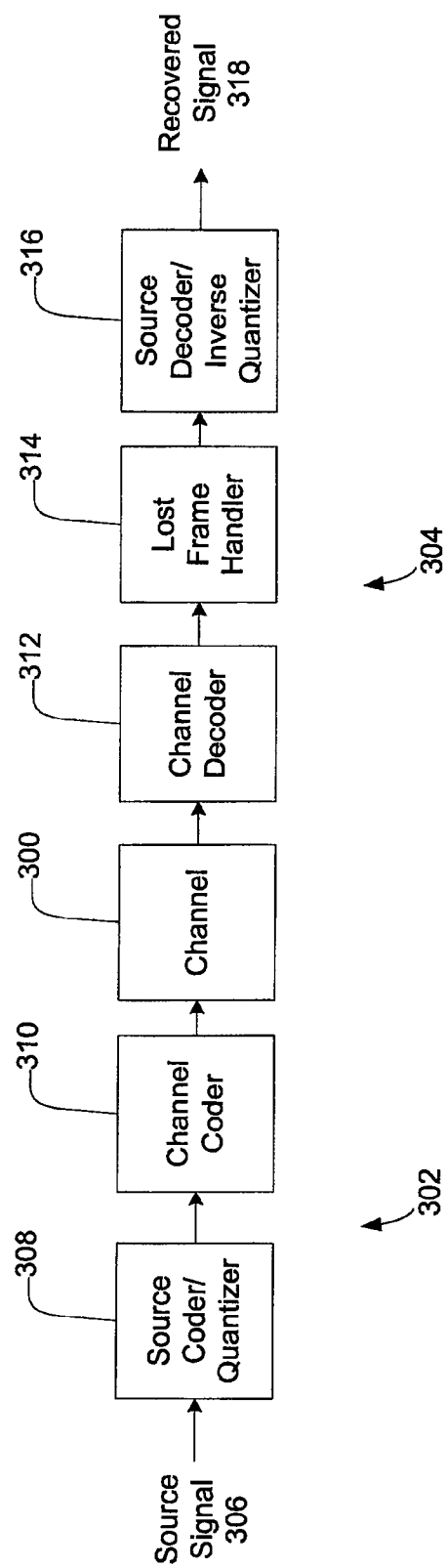
FIG. 5 illustrates an exemplary embodiment of a system for coding and decoding a signal in a channel.

Having described the general mobile environment, the following description focuses on a channel in a communications system for communication among mobile devices 100. FIG. 5 is an illustration of such a channel 300 and a communications system, such as that found in, for example, GSM systems using full rate (FR), adaptive multi-rate (AMR), and other types of coding. The communications system generally includes coding components 302 and decoding components 304 for coding and decoding, respectively, a signal to be transmitted and received through the channel 300. In the context of the mobile device 100, the coding components 302 and decoding components 304 are included within, for example, DSP 160.

As shown in FIG. 5, a source signal 306, which is an information signal such as an analog voice signal, that is to be transmitted, is provided to a source coder/quantizer 308, which quantizes and compresses the source signal 306 in order to reduce or remove redundancies. The source coder 308 outputs a sequence of bits or, in some exemplary embodiments, codewords, which are a tool used in communications to represent a combination of bits that have been encoded for transmission. It will be understood that some distortion of the signal may occur during the quantization stage due to lossy compression or the like.

The source-coded signal is passed to a channel coder 310, which adds redundancy to compensate for errors introduced in the channel during transmission. The channel coder 310 typically adds bits to the sequence to allow for error detection and correction, for example, forward error checking (FEC) and cyclical redundancy check (CRC). The output of the channel coder 310 is a series or sequence of bits. The signal may also be otherwise encoded using various methods including, for example, time domain multiple access (TDMA) signals, code domain multiple access (CDMA) signals, global system for mobile communications (GSM) signals, or other types of communications signals.

It will be understood by one of skill in the art that the source coder 308 and the channel coder 310 may be implemented in hardware or software or some combination thereof. Further, either the source coder 308 or the channel coder 310 or the combination thereof may be referred to as an encoder.

The channel-coded signal then passes through the channel 300 where it may encounter interference, noise or other situations that lead to corruption of the bits that make up the signal.

The channel-coded signal is eventually received by a channel decoder 312 where the redundancy in the channel-coded signal, such as the FEC and CRC information, is used to check for or correct for errors in the signal and decode the channel-coded signal to produce a coded signal.

The coded signal produced by the channel decoder 312 is passed to a lost frame handler 314, which then generates data to replace any lost frames in the received sequence. The lost frame handler 314 uses Lost Frame Concealment (LFC) methods to replace a lost frame, using information from previous frames and varying processing parameters depending on certain conditions, to replace a lost frame or the like. These methods are described in more detail with regards to FIGS. 6-8.

The coded signal is then passed to a source decoder/inverse quantizer 316 for decoding to produce and output a recovered signal 318. In a codeword-based system, the source decoder 316 will typically use a table look-up to map the received codeword to a parameter value for output.

It will be understood by one of skill in the art that the channel decoder 312, lost frame handler 314 and source decoder 316 may be implemented in hardware or software or some combination thereof. Further, either the channel decoder 312 or the source decoder 316 or the combination thereof including the lost frame handler 314 may be referred to as a decoder.

It should also be understood by those skilled in the art that the components shown in FIG. 5, provide one exemplary embodiment for source coding and decoding, channel coding and decoding and that different processing schemes can be used in conjunction with the lost frame handler 314.

For certain types of data, there are certain techniques that are used by the lost frame handler 314 for handling lost data frames. The methods that are used employ certain rules for dealing with lost data frames as well as subsequent data frames that are received. Typically, a set of parameters is applied to a current data frame based on the previous data frame. However, the processing that is typically applied to the current data frame does not take into account channel conditions in certain instances, which can have an effect on the quality of the recovered signal. The technique can be applied to speech signals and in particular speech frames, on a frame or subframe basis as is described in more detail below. The term data set used herein is meant to cover a frame or a subframe of speech data.

Figure 6:
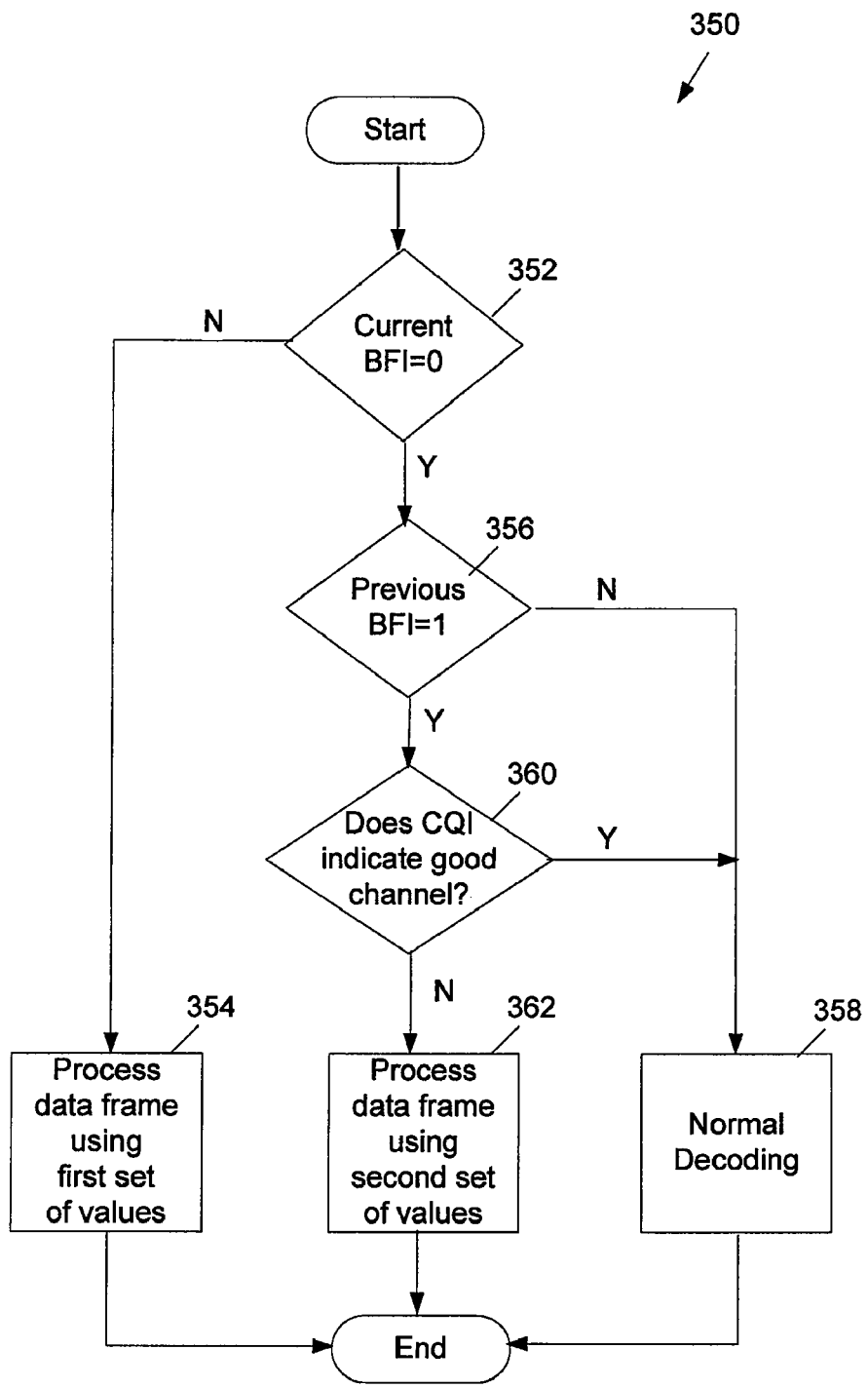
FIG. 6 illustrates a flow chart diagram of an exemplary embodiment of a lost frame concealment method.

Accordingly, the mobile device 100 employs a lost frame concealment method that takes into account the channel conditions when processing a current speech frame while at the same time taking into account whether the previous speech frame was a "good" frame, i.e. the previous speech frame was received without error, or a "bad" frame, i.e. the previous speech frame was received with an error. An exemplary embodiment of such a lost frame concealment method 350 is shown in FIG. 6.

The lost frame concealment method 350 operates on speech frames that are received and decoded by the channel decoder 312. The lost frame concealment method 350 begins at step 352 at which point the Bad Frame Indicator (BFI) value of the current speech frame is checked. If the BFI value is 1, indicating that the current speech frame is bad, i.e. it has errors, then the lost frame concealment method 350 moves to step 354 at which point one or more parameters applied to the speech frame are limited by a first set of values. If only one gain parameter is affected, then the first set of values only includes one value. The lost frame concealment method 350 then ends for the current speech frame. The lost frame concealment method 350 can begin once more if another speech frame requires processing for lost frame handling.

Alternatively, if at step 352, the BFI value for the current speech frame is 0 indicating that the current speech frame is good, i.e. it has no errors, then the lost frame concealment method 350 proceeds to step 356 at which point it is determined whether the BFI value for the previous speech frame was 1. If this is false, then both the current and previous data frames are good (i.e. no errors), and the lost frame concealment method 350 moves to step 358 at which point normal source decoding is employed by the source decoder 316. However, if the BFI value for the previous speech frame was 1, then the lost frame concealment method 350 moves to step 360 at which point the quality of the channel 300 is determined by checking the value of a Channel Quality Indicator (CQI). If the CQI indicates good channel conditions, then the lost frame concealment method 350 proceeds to step 358 at which point normal processing is applied to the speech frame. Otherwise, the lost frame error concealment method 350 proceeds to step 362 at which point the speech frame is processed using a second set of values that may be different than the first set of values. For instance, one or more parameters that are applied to the speech frame, can be limited according to the corresponding one or more values in the second set of values. The amount of limitation applied in steps 354 and 362 can be different.

The CQI can be represented by various parameters including Bit Error Rate (BER), BLock Error Ratio (BLER), Signal to Noise Ratio (SNR), as well as other suitable known parameters, which correspond to different measurements that indicate channel condition. Alternatively, the CQI can be a specially defined parameter as long as it indicates channel conditions. In any of these cases, the CQI is compared with a threshold value to determine whether the channel 300 is good. For instance, if the CQI is BER, then the BER can be compared to a threshold at step 360 and if the BER is greater than or equal to the threshold, then the current conditions for the channel 300 are poor and the method 350 moves to step 362. Otherwise if the BER is less than the threshold, then the current conditions for the channel is good and the method moves to step 358.

A value for the threshold can be obtained, for the channel quality indicator that is used, through a priori knowledge of the channel and its effect on the channel quality indicator under good and bad channel conditions. Alternatively, this information can be obtained through testing to obtain suitable values for the threshold.

With regards to speech traffic channels, techniques such as Adaptive Multi-Rate (AMR) speech codec error concealment of lost frames, and substitution and muting of lost frames for Enhanced Full Rate (EFR) speech traffic channels, have been typically used to process speech frames depending on whether errors are detected in current and previous speech frames. For instance, when no error is detected in a current speech frame but the previous speech frame had an error, these techniques conventionally always apply a change to the gains applied to the current speech frame. However, this processing approach is not appropriate under all circumstances.

For instance, with respect to 3GPP TS 46.061 substitution and muting of lost frames for Enhanced Full Rate (EFR) speech traffic channels, in previous solutions for substitution and muting of lost speech frames, when no error was detected in the received speech frame but the previous received speech frame was bad, the Long Term Prediction (LTP) gain and fixed codebook gain was limited below the values used for the last received good frame. This approach may provide acceptable performance when the channel condition is poor and the probability of the current speech frame being good (i.e. no errors) is low. However, this approach will degrade speech performance greatly when the channel condition is actually good and the previous frame is bad due to various reasons such as when a Fast Associated Control CHannel (FACCH) frame is used, for example. An FACCH channel is inserted based on the current need of the communication system. When a speech frame is replaced by an FACCH frame, the BFI value is set to "bad" because the frame contains no useful information for speech decoding.

This can be further understood by looking at a situation involving handover under good channel conditions. In this case, the wireless network 200 will send out a series of FACCH frames until it receives a response from the mobile device 100. Analysis of network activity shows that a typical pattern of frames in this instance consists of a dozen frames with FACCH frames embedded in every other frame. When the current frame is bad (i.e. BFI=1) and the BFI value for the previous frame was good or bad (prevBFI=0 or 1), the LTP gain and fixed codebook gain are replaced by attenuated versions of the values of LTP gain and fixed codebook gain used from one or more previous frames. However, when the current frame is good (i.e. BFI=0) and the previous frame was bad (i.e. prevBFI=1), the LTP gain and fixed codebook gain are again replaced by attenuated values from one or more previous frames. If frames are received such that there is an alternating pattern of frames with (BFI=1, prevBFI=0/1) and (BFI=0, prevBFI=1), then despite the fact that good speech frames are received half of the time, the result of the conventional methods used in AMR and EFR speech codec error concealment unit is that there is attenuated speech for the first 6 frames and muting for the rest of the frames. It should be noted that the length of each speech frame is 20 ms, and this result of attenuated and muted speech will leave a noticeable gap in the speech in the recovered signal 318.

Another approach to better handle this situation is to apply the lost frame concealment method 350. In this case, when the current frame is good and the previous frame was bad (BFI=0, prevBFI=1), the channel quality indicator is checked first. The LTP-gain and fixed codebook gain will be limited when the channel quality indicator indicates a poor channel condition. In this way, good frames that are in between bad speech frames will be used and the result is an improvement in speech quality. Accordingly, in this example, the lost frame concealment method 350 makes use of the distinction between frame erasures due to FACCH versus poor channel conditions. This will now be described in more detail with regards to an exemplary embodiment.

The lost frame concealment method 350 can be part of a modified frame substitution and muting procedure, which can be used by an AMR speech codec receiving end when one or more lost speech frames are received. In this case, the purpose of error concealment is to conceal the effect of lost AMR speech frames. The purpose of muting the received speech frames in the case of several lost frames is to indicate the breakdown of the channel to the user and to avoid generating possibly annoying sounds as a result from the error concealment procedure.

For the purposes of error detection, if the most sensitive bits of AMR speech data are received in error, the wireless network 200 can set a flag RX_TYPE to SPEECH_BAD in which case the BFI flag is set to 1 to indicate a bad data frame. If an SID frame is received in error, the wireless network 200 can set the RX_TYPE flag to SID_BAD in which case the BFI flag is also set to 1 to indicate a bad data frame. If these flags are set, the decoder components 304 shall perform parameter substitution to conceal errors. The RX_TYPE flag can be set to SPEECH_PROBABLY_DEGRADED by using channel quality information from the channel decoder 312, in which case the Potentially Degraded Frame Indication (PDFI) flag is also set.

In the case of lost speech frames, normal decoding of such frames would result in very unpleasant noise effects. In order to improve subjective quality, lost speech frames are typically substituted with either a repetition or an extrapolation of at least one previous good speech frame. This substitution is done so that it gradually will decrease the output level, resulting in silence at the output recovered signal 318, if several consecutive lost speech frames are received.

Figure 7:
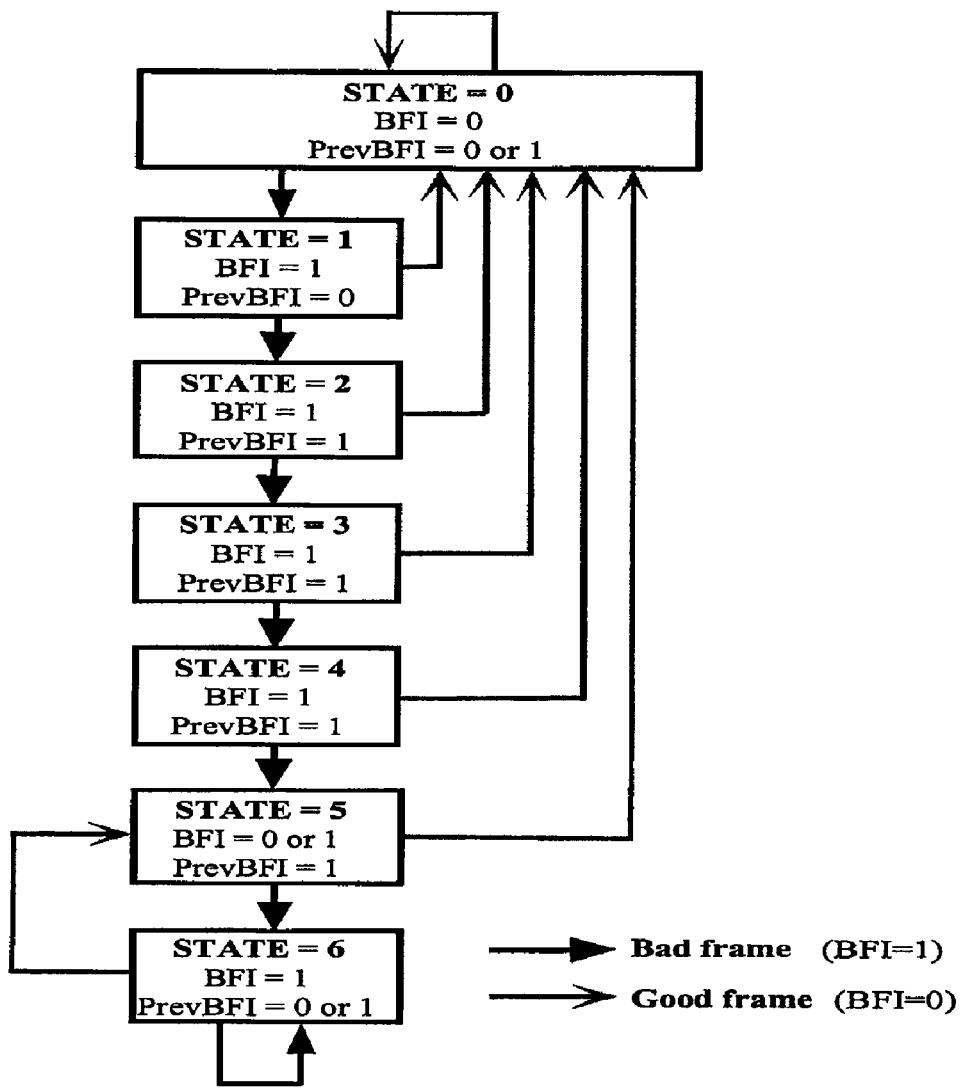
FIG. 7 illustrates a state diagram that can be used in an exemplary lost frame concealment method.

An exemplary solution for substitution and muting incorporates a state machine with seven states as shown in FIG. 7. The state machine starts in state 0. Each time a bad frame is detected, the state counter is incremented by one and is saturated when it reaches 6. Each time a good speech frame is detected, the state counter is reset to zero, except when in state 6, at which point the state counter is set to 5. The value of the state counter indicates the quality of the channel: the larger the value of the state counter, the worse the channel quality is. In addition to this state machine, the BFI value for the previously received data frame is checked (i.e. prevBFI). The processing generally depends on the value of the state variable. However, in states 0 and 5, the processing also depends on the two flags BFI and prevBFI, as will now be explained.

When BFI=0, prevBFI=0, and state=0, there is no error that is detected in the currently received or in the previously received speech frame. In this context no error means that, there is no error detected for a system like 802.11 or no error in CRC protected fields in GSM. That is, the most sensitive bits are received with no error but the less sensitive bits may contain some errors but do not have a significant effect on speech decoding. The received speech parameters are used in the normal way during speech synthesis. The speech parameters for the current frame are saved. These actions correspond to step 358 for method 350.

When BFI=0, prevBFI=1, and the state=0 or 5, no error is detected in the currently received speech frame, but the previously received speech frame was bad. The channel conditions are checked using a channel quality indicator as in step 360 of method 350. If the channel conditions are good, the LTP gain and fixed codebook gain are not limited and normal decoding takes place using the received parameters, which corresponds to step 358 of method 350. However, if the channel conditions are poor, then the LTP gain and fixed codebook gain are then limited below the values used for the last subframe in the last received good frame as shown in equations 1 and 2 respectively. This corresponds to step 362 in method 350. A subframe can have a time interval on the order of milliseconds such as 5 ms for example and there are several subframes in a frame. For example, there can be four subframes in a frame. BFI and prevBFI are only updated on a frame-by-frame basis.

$$g^p = \begin{cases} g^p, & g^p \leq g^p(-1) \\ g^p(-1), & g^p > g^p(-1) \end{cases} \quad (1)$$

$$g^c = \begin{cases} g^c, & g^c \leq g^c(-1) \\ g^c(-1), & g^c > g^c(-1) \end{cases} \quad (2)$$

In equation 1, $g^p$ is the current decoded LTP gain that is applied to the current frame, $g^p(-1)$ is the LTP gain that was used for the last subframe in the last good frame (i.e. when BFI was 0). In equation 2, $g^c$ is the current decoded fixed codebook gain that is applied to the current frame and $g^c(-1)$ is the fixed codebook gain used for the last subframe in the last good frame (i.e. when BFI was 0). The rest of the received speech parameters are used normally during speech synthesis. The speech parameters for the current frame are saved. This operation corresponds to step 362 in method 350.

It is understood that a fixed codebook contains excitation vectors for speech synthesis filters. The contents of the codebook are non-adaptive (i.e. fixed). In an adaptive multi-rate codec, the fixed codebook is implemented using an algebraic codebook. Alternatively, an adaptive codebook contains excitation vectors that are adapted for every subframe. The adaptive codebook is derived from a long-term filter state. The lag value can be viewed as an index into the adaptive codebook.

When BFI=1, prevBFI=0 or 1, and the state=1 . . . 6, an error is detected in the currently received speech frame and a substitution and muting procedure is started. The LTP gain and fixed codebook gain are replaced by attenuated values from several previous subframes according to equations 3 and 4. This corresponds to step 354 in method 350.

The LTP-lag values can be replaced by the past value from the 4$^{th}$ subframe of the previous frame or slightly modified values based on the last correctly received value. The received fixed codebook innovation pulses from the erroneous frame can be used in the state in which they were received when corrupted data is received. In the case where no data was received, random fixed codebook indices can be employed.

Figure 8:
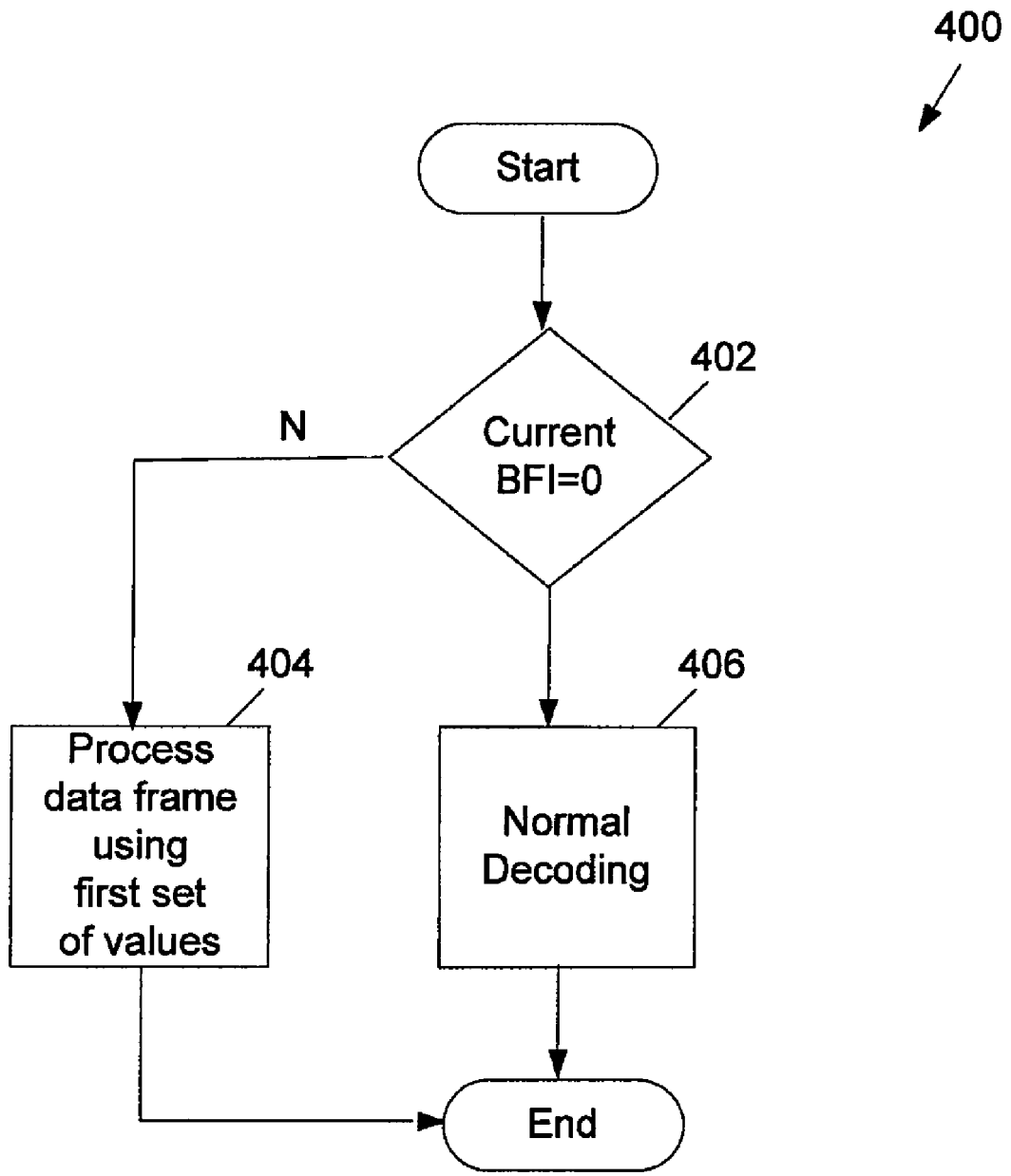
FIG. 8 illustrates a flow chart diagram of another exemplary embodiment of a lost frame concealment method.

Referring now to FIG. 8, shown therein is a flow chart diagram of another exemplary embodiment of a lost frame concealment method 400. The method 400 is somewhat similar to the method 350. The method begins at step 402 at which point it is determined whether the current data frame is erroneous or bad. If this is true then the method 400 moves to step 404 at which point the data frame is processed using one or more parameters and a first set of values is used to limit one or more of the parameters. If the current data frame is not erroneous then the method 400 moves to step 406 in which the parameters are used without modification or limitation to process the current data frame. Accordingly, the method 400 provides the same benefit as the method 350 when the condition of the channel 300 is good but the method 400 is not as robust as the method 350 when the condition of the channel 300 is poor. In the context of the example that was just given, when BFI=0, prevBFI=0, and state=0 or when BFI=0, prevBFI=1, and state=0 or 5, then no error is detected in the received speech frame but an error may or may not have been detected in the previous received speech frame. Accordingly, the received speech parameters are used in the normal way during speech synthesis for the current received speech frame, on a frame or a subframe basis, and the speech parameters are saved for the current frame.

The error concealment handling embodiments described herein are intended to provide improved voice quality for the $$g^p = \begin{cases} P(\text{state}) \, g^p(-1), & g^p(-1) \leq \text{median5}(g^p(-1), \ldots, g^p(-5)) \\ P(\text{state}) \, \text{median5}(g^p(-1), \ldots, g^p(-5)), & g^p(-1) > \text{median5}(g^p(-1), \ldots, g^p(-5)) \end{cases} \quad (3)$$

$$g^c = \begin{cases} C(\text{state}) \, g^c(-1), & g^c(-1) \leq \text{median5}(g^c(-1), \ldots, g^c(-5)) \\ C(\text{state}) \, \text{median5}(g^c(-1), \ldots, g^c(-5)), & g^c(-1) > \text{median5}(g^c(-1), \ldots, g^c(-5)) \end{cases} \quad (4)$$

In equation 3, $g^p$ is the current decoded LTP gain, $g^p(-1)$, . . . , $g^p(-n)$ are the LTP gains used for the last n subframes, median5( ) is a 5-point median operation, P(state) is an attenuation factor: (P(1)=0.98, P(2)=0.98, P(3)=0.8, P(4)=0.3, P(5)=0.2, P(6)=0.2, and state is the state value. In equation 4, $g^c$ is the current decoded fixed codebook gain, $g^c(-1)$, . . . , $g^c(-n)$ are the fixed codebook gains used for the last n subframes, median5( ) is a 5-point median operation, C(state) is an attenuation factor: (C(p)=0.98, C(2)=0.98, C(3)=0.98, C(4)=0.98, C(5)=0.98, C(6)=0.7), state is the state value, and n is a positive integer.

The higher the state value is, the more the gains are attenuated. Also the memory of the predictive fixed codebook gain is updated by using the average value of the past four values in the memory as shown in equation 5, and the past LSFs are shifted towards their mean as shown in equation 6.

$$\text{ener}(0) = \frac{1}{4} \sum_{i=1}^{4} \text{ener}(-i) \quad (5)$$

$$\text{lsf\_q1}(i) = \text{lsf\_q2}(i) = \alpha \, \text{past\_lsf\_q}(i) + (1-\alpha)\text{mean\_lsf}(i), \quad (6)$$
$$i = 0 \ldots 9$$

In equation 6, $\alpha$=0.95, lsf_q1 and lsf_q2 are two sets of LSF-vectors for the current frame, past_lsf_q is lsf_q2 from the previous frame, and mean_lsf is the average LSF-vector.

mobile device 100 (e.g. a GSM handset) under both good and poor channel conditions. It will be further understood that the system and method of coding and decoding signals and handling lost frames described above may be implemented as either hardware or software or some combination thereof. Further, methods and software may be implemented as executable software instructions stored on computer-readable media, which may include transmission-type media, which may be executed in a computer.

According to an exemplary embodiment described herein, there is provided a lost frame concealment method for processing data frames received from transmission over a communications channel. The method comprises: a) determining whether a current data frame is a bad frame; b) performing source decoding on the current data frame with one or more parameters, the one or more parameters being limited by a first set of one or more values if the current data frame is a bad frame; and c) performing source decoding on the current data frame with one or more parameters, wherein the one or more parameters are not limited if the current data frame is a good frame.

The method comprises performing step (c) when the previous data frame is a good frame.

Alternatively, if the previous data frame is a bad data frame, the method further comprises: d) determining a value for a channel quality indicator to determine the condition of the communications channel by comparing the value of the channel quality indicator to a threshold; e) performing step (c) if the condition of the communications channel is good; and f) performing source decoding on the current data frame with one or more parameters, the one or more parameters being limited by a second set of one or more values if the condition of the communications channel is bad.

The second set of one or more values can be different from the first set of one or more values.

The channel quality indicator can be one of a Bit Error Rate (BER), a BLock Error Ratio (BLER), a Signal to Noise Ratio (SNR) and a specially defined parameter that indicates channel condition.

In at least some instances, the data frames include speech frames, and the method is applied in an Adaptive Multi-Rate (AMR) speech decoding for concealing the effect of lost AMR speech frames.

In at least some instances, a state machine is used to indicate the quality of the communications channel, and the method further comprises: e) starting the state machine in state 0; f) incrementing a state counter to enter a subsequent numbered state each time a bad frame is detected, the incrementing being limited to 6; and g) resetting the state counter to zero each time a good speech frame is detected except when in state 6 in which case the state counter is set to 5.

In these instances, step (c) is performed in state 0, in which the method comprises not limiting Long Term Prediction (LTP) gain and fixed codebook gain, performing normal source decoding and saving the current frame of speech parameters.

Also in these instances, steps (d) to (f are performed in state 0 or state 5 when the current data frame is a good data frame and the previous data frame is a bad data frame, and step (f) comprises limiting LTP gain and fixed codebook gain below values used for the last subframe in the last received good speech frame according to:

$$g^p = \begin{cases} g^p, & g^p \leq g^p(-1) \\ g^p(-1), & g^p > g^p(-1) \end{cases}, \text{ and}$$

$$g^c = \begin{cases} g^c, & g^c \leq g^c(-1) \\ g^c(-1), & g^c > g^c(-1) \end{cases}$$

where $g^p$ is a current LTP gain that is applied to the current speech frame, $g^p(-1)$ is the LTP gain that was used for the last subframe in the last good received speech frame, $g^c$ is a current decoded fixed codebook gain that is applied to the current speech frame and $g^c(-1)$ is a fixed codebook gain that was used for the last subframe of the last good received speech frame, and the method further comprises using any remaining received speech parameters normally, and saving the speech parameters for the current speech frame.

Also in these instances, step (b) is performed in all states when the current data frame is a bad data frame, and step (b) comprises limiting LTP gain and fixed codebook gain below values used for the last subframe in the last received good speech frame according to where $g^p$ is a current decoded LTP gain, $g^p(-1), \ldots, g^p(-n)$ are LTP gains used for the last n subframes, median5( ) is a 5-point median operation, P(state) is an attenuation factor defined by: (P(1)=0.98, P(2)=0.98, P(3)=0.8, P(4)=0.3, P(5)=0.2, P(6)=0.2), $g^c$ is a current decoded fixed codebook gain, $g^c(-1), \ldots, g^c(-n)$ are fixed codebook gains used for the last n subframes, C(state) is an attenuation factor defined by: (C(1)=0.98, C(2)=0.98, C(3)=0.98, C(4)=0.98, C(5)=0.98, C(6)=0.7), state is the state value, and n is a positive integer.

In another aspect, at least one exemplary embodiment described herein provides a computer program product comprising a computer readable medium embodying program code means executable by a processor of a communications device for causing the communication device to implement the lost frame concealment method for processing data frames received from transmission over a communications channel.

In another aspect, at least one exemplary embodiment described herein provides a communications device comprising: a) a microprocessor configured to control the operation of the communications device; b) a communication subsystem connected to the microprocessor, the communication subsystem being configured to send and receive wireless data over a communications channel; c) a channel decoder configured to decode data frames received over the communications channel; and d) a lost frame handler configured to process the received data frames for lost frames, the lost frame handler being configured to determine whether a current received data frame is a bad frame, perform source decoding on the current received data frame with one or more parameters being limited by a first set of one or more values if the current received data frame is a bad frame, and perform source decoding on the current received data frame with one or more parameters that are not limited if the current received data frame is a good frame.

In another aspect, at least one exemplary embodiment described herein provides a communication system for coding and decoding an information signal sent through a communications channel. The system comprises: an encoder configured to encode the information signal and send the encoded information signal over the communications channel; and a decoder configured to receive and decode the encoded information signal to produce a recovered signal, wherein the decoder is configured to process received data frames for lost frames by determining whether a current received data frame is a bad frame, perform source decoding on the current received data frame with one or more parameters being limited by a first set of one or more values if the current received data frame is a bad frame, and perform source decoding on the current received data frame with one or more parameters that are not limited if the current received data frame is a good frame.

It should be understood that various modifications can be made to the embodiments described and illustrated herein, without departing from the embodiments, the general scope of which is defined in the appended claims.

$$g^p = \begin{cases} P(\text{state}) \; g^p(-1), & g^p(-1) \leq \text{median5}(g^p(-1), \ldots, g^p(-5)) \\ P(\text{state}) \; \text{median5}(g^p(-1), \ldots, g^p(-5)), & g^p(-1) > \text{median5}(g^p(-1), \ldots, g^p(-5)) \end{cases}$$

and $$g^c = \begin{cases} C(\text{state}) \; g^c(-1), & g^c(-1) \leq \text{median5}(g^c(-1), \ldots, g^c(-5)) \\ C(\text{state}) \; \text{median5}(g^c(-1), \ldots, g^c(-5)), & g^c(-1) > \text{median5}(g^c(-1), \ldots, g^c(-5)) \end{cases}$$

We claim:

1. A lost frame concealment method for processing data frames received from transmission over a communications channel, wherein the method comprises:
    a) determining whether a current data frame is a bad frame;
    b) performing source decoding on the current data frame with one or more parameters, the one or more parameters being limited by a first set of one or more values if the current data frame is a bad frame;
    c) performing source decoding on the current data frame with one or more parameters, wherein the one or more parameters are not limited if the current data frame is a good frame;
    d) determining a value for a channel quality indicator to determine if the condition of the communications channel is good or bad by comparing the value of the channel quality indicator to a threshold if the current data frame is a good data frame and the previous data frame is a bad data frame;
    e) performing source decoding on the current data frame with one or more parameters, wherein the one or more parameters are not limited if the current data frame is a good data frame, the previous data frame is a bad data frame and the condition of the communications channel is good; and
    f) performing source decoding on the current data frame with one or more parameters, the one or more parameters being limited by a second set of one or more values if the condition of the communications channel is bad, the current data frame is a good data frame and the previous data frame is a bad data frame,
wherein the data frames include speech frames;
wherein a state machine is used to indicate the quality of the communications channel, and the method further comprises:
    q) starting the state machine in state 0;
    h) incrementing a state counter to enter a subsequent numbered state each time a bad frame is detected, the incrementing being limited to 6; and
    i) resetting the state counter to zero each time a good speech frame is detected except when in state 6 in which case the state counter is set to 5; and
wherein steps (d) to (f) are performed in state 0 or state 5 when the current data frame is a good data frame and the previous data frame is a bad data frame, and step (f) comprises limiting Long Term Prediction (LTP) gain and fixed codebook gain below values used for a last subframe in a last received good speech frame according to:

$$g^P = \begin{cases} g^P, & g^P \le g^P(-1) \\ g^P(-1), & g^P > g^P(-1) \end{cases},$$

and $$g^c = \begin{cases} g^c, & g^c \le g^c(-1) \\ g^c(-1), & g^c > g^c(-1) \end{cases}$$

where $g^P$ is a current LTP gain that is applied to a current speech frame, $g^P(-1)$ is the LTP gain that was used for the last subframe in the last good received speech frame, $g^c$ is a current decoded fixed codebook gain that is applied to the current speech frame and $g^c(-1)$ is a fixed codebook gain that was used for the last subframe of the last good received speech frame, and the method further comprises using any remaining received speech parameters normally, and saving the speech parameters for the current speech frame; and
wherein the bad frame is a data frame with an error and the good frame is a data frame with no errors.

2. The method of claim 1, wherein the method comprises performing step (c) when the previous data frame is a good frame.

3. The method of claim 1, wherein the second set of one or more values is different from the first set of one or more values.

4. The method of claim 1, wherein the channel quality indicator is one of a Bit Error Rate (BER), a Block Error Ratio (BLER), a Signal to Noise Ratio (SNR) and a specially defined parameter that indicates channel condition.

5. The method of claim 1, wherein the method is applied in an Adaptive Multi-Rate (AMR) speech decoding for concealing the effect of lost AMR speech frames.

6. The method of claim 1, wherein step (c) is performed in state 0, in which the method comprises not limiting LTP gain and fixed codebook gain, performing normal source decoding and saving the current frame of speech parameters.

7. The method of claim 1, wherein step (b) is performed in all states when the current data frame is a bad data frame, and step (b) comprises limiting LTP gain and fixed codebook gain below values used for the last subframe in the last received good speech frame according to $$g^P = \begin{cases} P(\text{state}) \, g^P(-1), & g^P(-1) \le \text{median5}(g^P(-1), \ldots, g^P(-5)) \\ P(\text{state}) \, \text{median5}(g^P(-1), \ldots, g^P(-5)), & g^P(-1) > \text{median5}(g^P(-1), \ldots, g^P(-5)) \end{cases}$$

and $$g^c = \begin{cases} C(\text{state}) \, g^c(-1), & g^c(-1) \le \text{median5}(g^c(-1), \ldots, g^c(-5)) \\ C(\text{state}) \, \text{median5}(g^c(-1), \ldots, g^c(-5)), & g^c(-1) > \text{median5}(g^c(-1), \ldots, g^c(-5)) \end{cases}$$

where $g^P$ is a current decoded LTP gain, $g^P(-1), \ldots g^P(-n)$ are LTP gains used for the last n subframes, median5( ) is a 5-point median operation, P(state) is an attenuation factor defined by: (P(1) =0.98, P(2) =0.98, P(3) =0.8, P(4) =0.3, P(5) =0.2, P(6) =0.2), $g^c$ is a current decoded fixed codebook gain, $g^c(-1), \ldots, g^c(-n)$ are fixed codebook gains used for the last n subframes, C(state) is an attenuation factor defined by: (C(1) =0.98, C(2) =0.98, C(3) =0.98, C(4) =0.98, C(5) =0.98, C(6) =0.7), state is the state value, and n is a positive integer.

8. A computer program product comprising a non-transitory computer readable medium embodying program code means executable by a processor of a communications device for causing said communication device to implement a lost frame concealment method for processing data frames received from transmission over a communications channel, wherein the method comprises:
    a) determining whether a current data frame is a bad frame;
    b) performing source decoding on the current data frame with one or more parameters, the one or more parameters being limited by a first set of one or more values if the current data frame is a bad frame;

c) performing source decoding on the current data frame with one or more parameters, wherein the one or more parameters are not limited if the current data frame is a good frame;

d) determining a value for a channel quality indicator to determine if the condition of the communications channel is good or bad by comparing the value of the channel quality indicator to a threshold if the current data frame is a good data frame and the previous data frame is a bad data frame;

e) performing source decoding on the current data frame with one or more parameters, wherein the one or more parameters are not limited if the current data frame is a good data frame, the previous data frame is a bad data frame and the condition of the communications channel is good; and f) performing source decoding on the current data frame with one or more parameters, the one or more parameters being limited by a second set of one or more values if the condition of the communications channel is bad, the current data frame is a good data frame and the previous data frame is a bad data frame, wherein the data frames include speech frames;

wherein a state machine is used to indicate the quality of the communications channel, and the method further comprises:

g) starting the state machine in state 0;

h) incrementing a state counter to enter a subsequent numbered state each time a bad frame is detected, the incrementing being limited to 6; and i) resetting the state counter to zero each time a good speech frame is detected except when in state 6 in which case the state counter is set to 5; and wherein steps (d) to (f) are performed in state 0 or state 5 when the current data frame is a good data frame and the previous data frame is a bad data frame, and step (f) comprises limiting Long Term Prediction (LTP) gain and fixed codebook gain below values used for a last subframe in a last received good speech frame according to:

$$g^P = \begin{cases} g^P, & g^P \leq g^P(-1) \\ g^P(-1), & g^P > g^P(-1) \end{cases}, \text{ and } g^c = \begin{cases} g^c, & g^c \leq g^c(-1) \\ g^c(-1), & g^c > g^c(-1) \end{cases}$$

where $g^P$ is a current LTP gain that is applied to a current speech frame, $g^P(-1)$ is the LTP gain that was used for the last subframe in the last good received speech frame, $g^c$ is a current decoded fixed codebook gain that is applied to the current speech frame and $g^c(-1)$ is a fixed codebook gain that was used for the last subframe of the last good received speech frame, and the method further comprises using any remaining received speech parameters normally, and saving the speech parameters for the current speech frame; and wherein the bad frame is a data frame with an error and the good frame is a data frame with no errors.

9. The computer program product of claim 8, wherein the program code means is further configured for performing step (c) when the previous data frame is a good frame.

10. The computer program product of claim 8, wherein the program code means is further configured to generate the channel quality indicator based on one of a Bit Error Rate (BER), a BLock Error Ratio (BLER), a Signal to Noise Ratio (SNR) and a specially defined parameter that indicates channel condition.

11. A communications device comprising:

a microprocessor configured to control the operation of the communications device;

a communication subsystem connected to the microprocessor, the communication subsystem being configured to send and receive wireless data over a communications channel;

a channel decoder configured to decode data frames received over the communications channel; and a lost frame handler configured to process the received data frames for lost frames, the lost frame handler being configured to: a) determine whether a current received data frame is a bad frame; b) perform source decoding on the current received data frame with one or more parameters being limited by a first set of one or more values if the current received data frame is a bad frame; c) perform source decoding on the current received data frame with one or more parameters that are not limited if the current received data frame is a good frame; d) determine a value for a channel quality indicator to determine if the condition of the communications channel is good or bad by comparing the value of the channel quality indicator to a threshold if the current data frame is a good data frame and the previous data frame is a bad data frame; e) perform source decoding on the current data frame with one or more parameters, wherein the one or more parameters are not limited if the current data frame is a good data frame, the previous data frame is a bad data frame and the condition of the communications channel is good; and f) perform source decoding on the current data frame with one or more parameters, the one or more parameters being limited by a second set of one or more values if the condition of the communications channel is bad, the current data frame is a good data frame and the previous data frame is a bad data frame, wherein the data frames include speech frames;

wherein a state machine is used to indicate the quality of the communications channel, and the lost frame handler is further configured to g) start the state machine in state 0;

h) increment a state counter to enter a subsequent numbered state each time a bad frame is detected, the incrementing being limited to 6; and i) reset the state counter to zero each time a good speech frame is detected except when in state 6 in which case the state counter is set to 5; and wherein steps (d) to (f) are performed in state 0 or state 5 when the current data frame is a good data frame and the previous data frame is a bad data frame, and step (f) comprises limiting Long Term Prediction (LTP) gain and fixed codebook gain below values used for a last subframe in a last received good speech frame according to:

$$g^P = \begin{cases} g^P, & g^P \leq g^P(-1) \\ g^P(-1), & g^P > g^P(-1) \end{cases}, \text{ and } g^c = \begin{cases} g^c, & g^c \leq g^c(-1) \\ g^c(-1), & g^c > g^c(-1) \end{cases}$$

where $g^P$ is a current LTP gain that is applied to a current speech frame, $g^P(-1)$ is the LTP gain that was used for the last subframe in the last good received speech frame, $g^c$ is a current decoded fixed codebook gain that is applied to the current speech frame and $g^c(-1)$ is a fixed codebook gain that was used for the last subframe of the last good received speech frame, and any remaining received speech parameters are used normally, and the speech parameters are saved for the current speech frame; and wherein the bad frame is a data frame with an error and the good frame is a data frame with no errors.

12. The communications device of claim 11, wherein the lost frame handler is further configured to perform step (iii) when the previous data frame is a good frame.

13. The communications device of claim 11, wherein the lost frame handler is further configured to generate the channel quality indicator based on one of a Bit Error Rate (BER), a BLock Error Ratio (BLER), a Signal to Noise Ratio (SNR) and a specially defined parameter that indicates channel condition.

14. A communication system for coding and decoding an information signal sent through a communications channel, wherein the system comprises:

encoder hardware configured to encode the information signal and send the encoded information signal over the communications channel;

decoder hardware configured to receive and decode the encoded information signal to produce a recovered signal, wherein the decoder hardware is configured to: a) process received data frames for lost frames by determining whether a current received data frame is a bad frame; b) perform source decoding on the current received data frame with one or more parameters being limited by a first set of one or more values if the current received data frame is a bad frame; c) perform source decoding on the current received data frame with one or more parameters that are not limited if the current received data frame is a good frame; d) determine a value for a channel quality indicator to determine if the condition of the communications channel is good or bad by comparing the value of the channel quality indicator to a threshold if the current data frame is a good data frame and the previous data frame is a bad data frame; e) perform source decoding on the current data frame with one or more parameters, wherein the one or more parameters are not limited if the current data frame is a good data frame, the previous data frame is a bad data frame and the condition of the communications channel is good; and f) perform source decoding on the current data frame with one or more parameters, the one or more parameters being limited by a second set of one or more values if the condition of the communications channel is bad, the current data frame is a good data frame and the previous data frame is a bad data frame, wherein the data frames include speech frames;

wherein a state machine is used to indicate the quality of the communications channel, and the decoder hardware is further configured to g) start the state machine in state 0;

h) increment a state counter to enter a subsequent numbered state each time a bad frame is detected, the incrementing being limited to 6; and i) reset the state counter to zero each time a good speech frame is detected except when in state 6 in which case the state counter is set to 5; and wherein steps (d) to (f) are performed in state 0 or state 5 when the current data frame is a good data frame and the previous data frame is a bad data frame, and step (f) comprises limiting Long Term Prediction (LTP) (gain and fixed codebook gain below values used for a last subframe in a last received good speech frame according to:

$$g^P = \begin{cases} g^P, & g^P \leq g^P(-1) \\ g^P(-1), & g^P > g^P(-1) \end{cases}, \text{ and } g^c = \begin{cases} g^c, & g^c \leq g^c(-1) \\ g^c(-1), & g^c > g^c(-1) \end{cases}$$

where $g^P$ is a current LTP gain that is applied to a current speech frame, $g^P(-1)$ is the LTP gain that was used for the last subframe in the last good received speech frame, $g^c$ is a current decoded fixed codebook gain that is applied to the current speech frame and $g^c(-1)$ is a fixed codebook gain that was used for the last subframe of the last good received speech frame, and any remaining received speech parameters are used normally, and the speech parameters are saved for the current speech frame; and wherein the bad frame is a data frame with an error and the good frame is a data frame with no errors.

15. The communication system of claim 14, wherein the decoder hardware is further configured to perform step (iii) when the previous data frame is a aood frame.

16. The communications system of claim 14, wherein the decoder hardware is further configured to generate the channel quality indicator based on one of a Bit Error Rate (BER), a BLock Error Ratio (BLER), a Signal to Noise Ratio (SNR) and a specially defined parameter that indicates channel condition.

* * * * *